United States Patent
Shaeffer

(10) Patent No.: US 9,218,243 B2
(45) Date of Patent: Dec. 22, 2015

(54) MEMORY SYSTEM FOR ERROR DETECTION AND CORRECTION COVERAGE

(75) Inventor: Ian P. Shaeffer, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 212 days.

(21) Appl. No.: 14/123,510

(22) PCT Filed: May 14, 2012

(86) PCT No.: PCT/US2012/037845
§ 371 (c)(1),
(2), (4) Date: Dec. 2, 2013

(87) PCT Pub. No.: WO2012/170154
PCT Pub. Date: Dec. 13, 2012

(65) Prior Publication Data
US 2014/0108889 A1    Apr. 17, 2014

Related U.S. Application Data

(60) Provisional application No. 61/493,934, filed on Jun. 6, 2011.

(51) Int. Cl.
G06F 11/10 (2006.01)
G11C 7/10 (2006.01)
G11C 5/04 (2006.01)
G11C 29/04 (2006.01)

(52) U.S. Cl.
CPC .......... *G06F 11/108* (2013.01); *G06F 11/1008* (2013.01); *G06F 11/1016* (2013.01); *G06F 11/1048* (2013.01); *G06F 11/1068* (2013.01); *G11C 7/10* (2013.01); *G11C 5/04* (2013.01); *G11C 2029/0411* (2013.01)

(58) Field of Classification Search
CPC  G06F 11/108; G06F 11/1008; G06F 11/1068
See application file for complete search history.

(56) References Cited

U.S. PATENT DOCUMENTS

| | | | |
|---|---|---|---|
| 5,056,095 A * | 10/1991 | Horiguchi et al. | 714/765 |
| 5,166,939 A * | 11/1992 | Jaffe et al. | 714/766 |
| 5,774,643 A * | 6/1998 | Lubbers et al. | 714/20 |
| 6,851,082 B1 * | 2/2005 | Corbett | 714/770 |
| 7,308,639 B2 | 12/2007 | Park et al. | |

(Continued)

OTHER PUBLICATIONS

PCT International Search Report and Written Opinion, PCT/US2012/037845, Oct. 30, 2012, 9 Pages.

(Continued)

*Primary Examiner* — Joseph D Torres
(74) *Attorney, Agent, or Firm* — Fenwick & West LLP

(57) ABSTRACT

A memory system supporting error detection and correction (EDC) coverage. The system includes a memory controller and a memory buffer. The memory buffer includes an interface to a first group of memory devices and an interface to a second group of memory devices. The memory buffer accesses data from the first group of memory devices and accesses first error information corresponding to the data from the second group of devices. The memory buffer also accesses additional data from the second group of memory devices and accesses second error information corresponding to the additional data from a device in the first group of memory devices. EDC coverage may also be configured by the memory controller so that some data accesses have EDC coverage and other data accesses do not have EDC coverage.

20 Claims, 14 Drawing Sheets

(56) References Cited

U.S. PATENT DOCUMENTS

| | | |
|---|---|---|
| 7,487,428 B2 | 2/2009 | Co et al. |
| 7,519,894 B2 | 4/2009 | Wei et al. |
| 7,895,502 B2 * | 2/2011 | Han et al. ............ 714/764 |
| 7,949,931 B2 | 5/2011 | Lastras-Montano |
| 8,468,423 B2 * | 6/2013 | Zvibel ............ 714/766 |
| 8,595,594 B2 * | 11/2013 | Liang ............ 714/766 |
| 8,694,849 B1 * | 4/2014 | Micheloni et al. ............ 714/753 |
| 8,732,557 B2 * | 5/2014 | Ratnam et al. ............ 714/773 |
| 8,984,374 B2 * | 3/2015 | Yoshihara ............ 714/766 |
| 2007/0033490 A1 | 2/2007 | Moosrainer et al. |
| 2008/0250292 A1 | 10/2008 | Djordjevic |
| 2010/0005365 A1 | 1/2010 | Buchmann et al. |
| 2010/0217915 A1 | 8/2010 | O'Connor et al. |
| 2010/0218064 A1 | 8/2010 | Ito |
| 2010/0269012 A1 | 10/2010 | Hazelzet |
| 2012/0151300 A1 | 6/2012 | Tillema |
| 2012/0311406 A1 * | 12/2012 | Ratnam et al. ............ 714/768 |

OTHER PUBLICATIONS

PCT International Preliminary Report on Patentability dated Dec. 27, 2013 (Chapter I) in International Application No. PCT/US2012/037845. 6 pages.

* cited by examiner

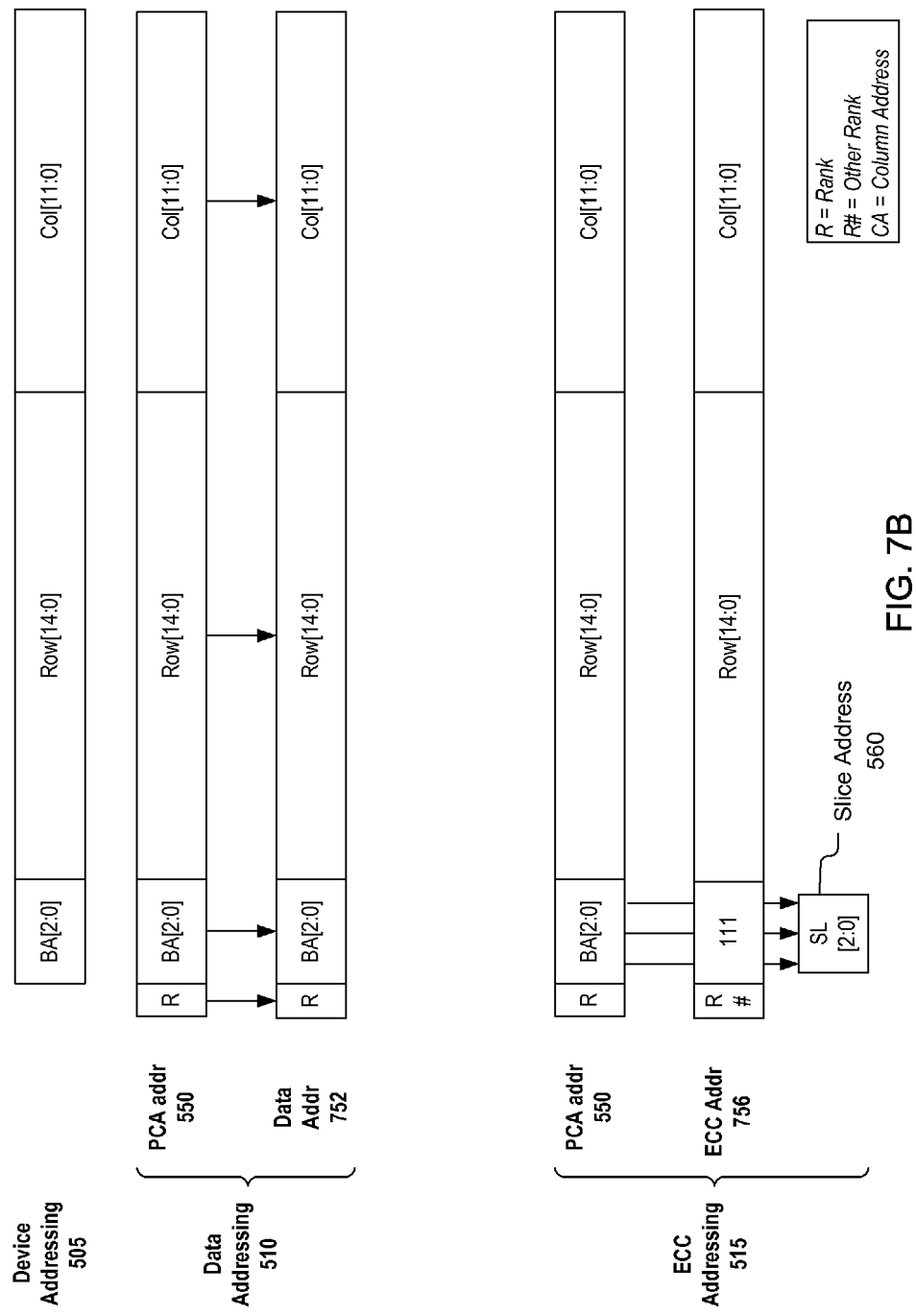

MEMORY SYSTEM FOR ERROR DETECTION AND CORRECTION COVERAGE

BACKGROUND

The present disclosure relates to memory systems, and more specifically to components of a memory system that include error detection and correction functionality.

Error detection and correction (EDC) techniques are used by memory systems to detect and correct errors that arise during memory accesses. EDC techniques operate by storing data along with an associated error correcting code (ECC) in the memory. Depending on the number of available ECC bits and the number of errors in the data, the errors may be detected and/or fixed.

BRIEF DESCRIPTION OF THE DRAWINGS

The teachings of the embodiments of herein can be readily understood by considering the following detailed description in conjunction with the accompanying drawings.

Figure (FIG. 1 illustrates a memory system supporting EDC coverage, according to one embodiment.

FIGS. 7A and 7B illustrate providing EDC coverage in a memory system, according to still another embodiment.

DETAILED DESCRIPTION OF EMBODIMENTS

Embodiments of the present disclosure relate to components of a memory system that support EDC coverage. In one embodiment, a memory controller generates commands for accessing data and transmits the access commands to a memory buffer. The memory buffer may be located on a memory module that includes at least two groups of memory devices. During one data access transaction, the memory buffer accesses data from the first group of memory devices and accesses error information (e.g., ECC) corresponding to the data from the second group of memory devices. During another data access transaction, the buffer accesses additional data from the second group of memory devices and accesses error information corresponding to the additional data from the first group of memory devices. Handling data accesses through a memory buffer allows EDC capabilities to be added to memory systems with no modification or only minimal modification to existing non-EDC memory controllers. For example, EDC capabilities can be added to a memory controller that has a standard 64 bit wide data bus without widening the data bus by 8 bits for carrying the error information or adding an extra memory device for storing the error information.

In some embodiments, the EDC coverage of the memory buffer is configurable. EDC may be statically activated for all memory accesses, or selectively activated for only particular memory accesses. Certain address ranges may also be programmed by the memory controller into the memory buffer as addresses that should be provided with EDC coverage. The use of a configurable memory buffer enables EDC coverage to be tailored to the particular needs of a memory system.

Note that the term "error information" throughout this disclosure is broadly defined as any information that can be used or associated with detecting and/or correcting an error that occurs within the data stored in a memory system. Moreover, the term "Error Correcting Code" (ECC) throughout this specification refers to error information used in a memory system for error detection and correction.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1:
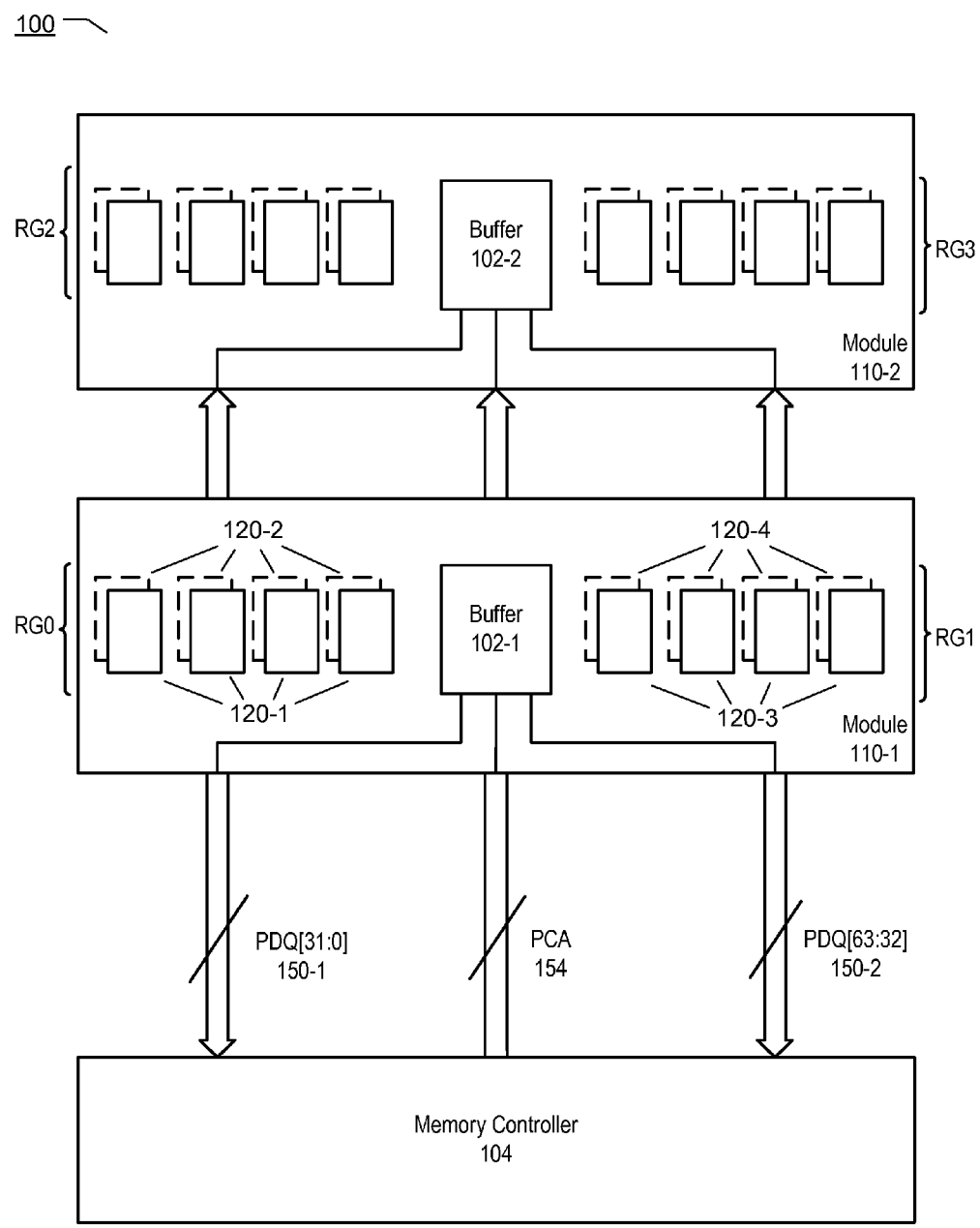

FIG. 1 illustrates a memory system 100 for EDC coverage, according to one embodiment. The memory system 100 includes a memory controller 104 coupled to two memory modules 110-1 and 110-2 through a primary command/address (PCA) link 154 and primary data (PDQ) links 150-1 and 150-2. PDQ links 150 may carry data signals, data strobe signals, data mask signals, etc. PCA links 154 may carry address signals, bank address signals, chip select signals, clock signals, clock enable signals, row address strobe (RAS) signals, column address strobe (CAS) signals, reset signals, write enable signals, etc. In some embodiments, the PCA link may be a bi-directional link for carrying signals in both directions between the memory controller 104 and memory modules 110.

In one embodiment, the memory system 100 has a multi-drop topology. In a multi-drop topology, each memory module 110 is directly connected to both of the PDQ links 150-1 and 150-2. In other embodiments, the system 100 has a dynamic point to point (DPP) topology. In a DPP topology, each half of the PDQ link 150 is directly connected to only a single memory module 110. For example, PDQ link 150-1 would be directly connected to module 110-1 and PDQ link 150-2 would be directly connected to module 110-2. If module 110-2 is not present, a continuity module would be used in its place to enable a connection between PDQ link 150-2 and module 110-1 via a separate link (not shown) that is coupled between both the continuity module and the memory module 110-1.

Each memory module 110 includes a memory buffer 102 and sixteen memory devices 120. The memory buffer 102 is an integrated circuit device that communicates with the memory devices 120 through secondary command/address (SCA) links (not shown) and secondary data (SDQ) links (not shown). The memory buffer 120 receives commands from the memory controller 104 via the PCA link 154. In one embodiment, the commands are for accessing data and ECC that is stored in the memory devices 120. The memory buffer 102 decodes the addresses in the commands, retrieves the data and associated ECC from the memory devices with the decoded addresses, performs EDC operations on the data, and transmits the data to the memory controller 104 via the PDQ 150 links. Beneficially, the memory buffer 102 enables EDC capabilities to be added to memory systems with no modification or only minimal modification to existing non-EDC memory controllers.

In some embodiments, the memory buffer 102 receives information from the memory controller 104 indicating whether data is associated with ECC. Some data accesses may have associated ECC, and other data accesses may not have associated ECC. If data is associated with ECC, the memory buffer 102 retrieves the ECC and performs the EDC operations.

Memory devices 120 are integrated circuit devices that represent any type of memory, for example, dynamic random access memory (DRAM), static random access memory (SRAM) or non-volatile memory. The memory devices 120 store data and associated ECC that can be accessed by the memory buffer 102. In one embodiment, the ECC is distributed among the various memory devices 120 so that the ECC is not concentrated within a single memory device 120. A portion of each memory device 120 is thus allocated for data and another portion of each memory device 120 is allocated for ECC. In some embodiments, for a particular data access transaction, the data and the ECC associated with that data are mapped to separate memory devices 120, which enables the data and the ECC for the data to be retrieved simultaneously.

The internal storage space of a memory device 120 is divided into banks, rows, and columns. For example, a single memory device 120 may have 8 banks, 32,768 rows, and 4096 columns. Information (i.e., data and ECC) can be stored to and retrieved from a memory device 120 by asserting a chip select signal to the memory device 120 and providing the appropriate bank address, row address, and column address.

The memory devices 120 of each module 110 are organized into logical ranks In the context of this disclosure, a rank is a set of memory devices that can be accessed for a specific memory transaction. As shown, memory module 110-1 is divided into four ranks of memory devices 120. Memory devices 120-1 are located on the front of the memory module 110-1 and form one rank of memory devices. Memory devices 120-2 are located on the back of the memory module 110-1 and form a second rank of memory devices. Memory devices 120-3 are located on the front of the memory module 110-1 and form a third rank of memory devices. Memory devices 120-4 are located on the back of the memory module 110-1 and form a fourth rank of memory devices. In other embodiments, all ranks of memory devices may be located on the same side of the memory module 110-1. The configuration of memory module 110-2 is similar to the configuration of memory module 110-1.

The ranks of memory devices 120 are also organized into "rank groups." Rank groups are groups of ranks that have an interdependency due to, for example, sharing of a data link. Rank groups are separated from each other by the lack of this interdependency. For example, referring to module 110-1, memory devices 120-1 and 120-2, which form two separate memory ranks, are in Rank Group 0 (RG0). Memory devices 120-3 and 120-4, which also form two separate memory ranks, are in Rank Group 1 (RG1). The ranks of memory devices in a rank group (e.g., RG0) are independently addressable from the ranks of memory devices in the other rank group (e.g., RG1) by the memory buffer 102-1 so that different simultaneous commands can be transmitted to rank groups RG0 and RG1. Similarly, the ranks of memory devices of module 110-2 can also be divided into separate rank groups (e.g., RG2 and RG3).

While FIG. 1 illustrates a memory system 100 having two memory modules 110 and sixteen memory devices 120 per module, other embodiments may have a different number of memory modules 110 or memory devices 120. Additionally, the memory devices 120 in FIG. 1 are meant to represent x8 memory devices that transfer eight bits of data at a time. In other embodiments, the memory modules 110 may have other types of memory devices 120, such as x4, x16, or x32 memory devices.

Figure 2:
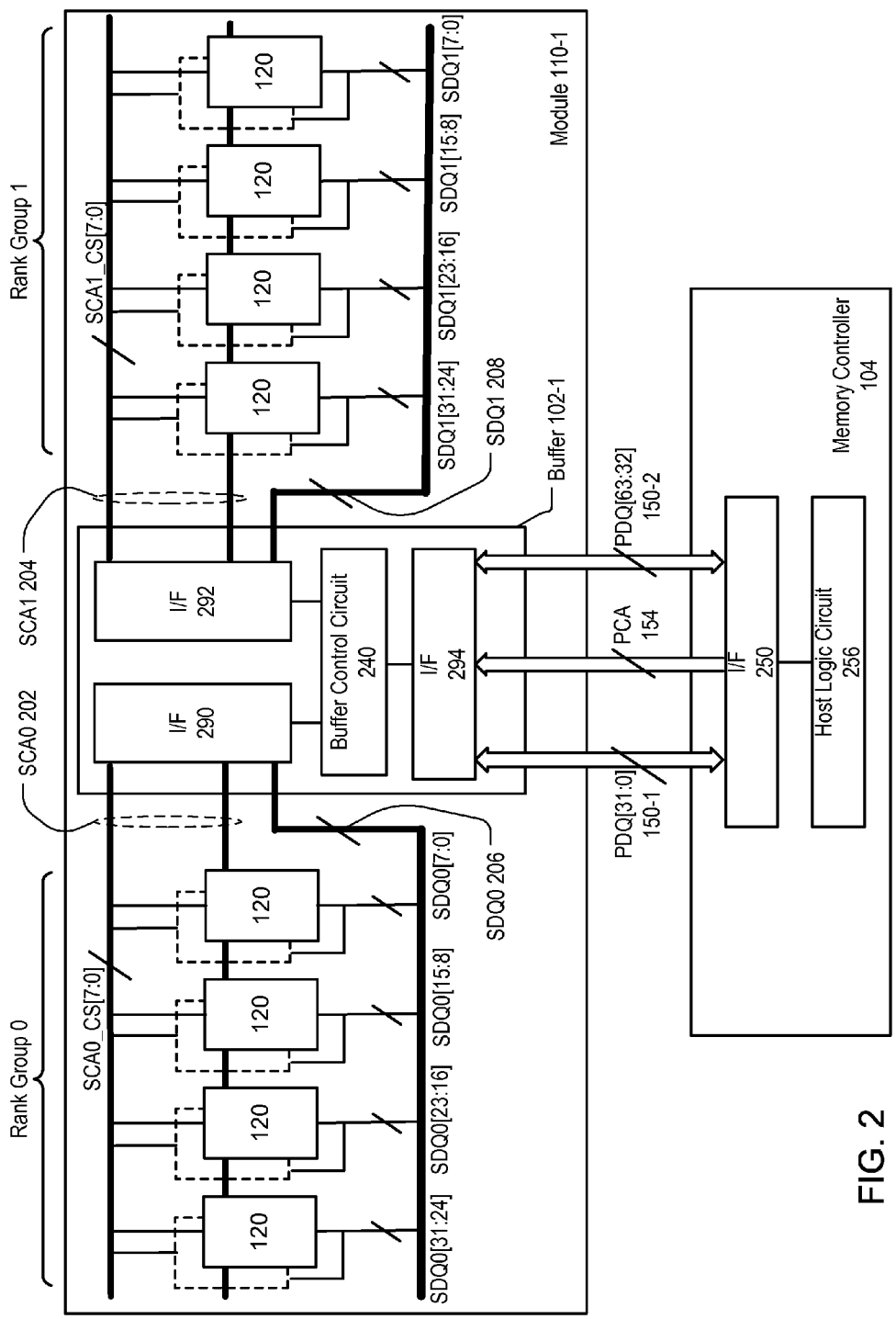
FIG. 2 illustrates a more detailed view of a memory system of FIG. 1, according to one embodiment.

Referring now to FIG. 2, illustrated is a more detailed view of the memory system 100 from FIG. 1, according to an embodiment. Shown in the figure are a memory controller 104 and a single memory module 110-1. Only one memory module 110-1 is shown for purposes of clarity. The configuration of memory module 110-2 is similar to the configuration of module 110-1 shown in FIG. 2.

The memory controller 104 includes a host logic circuit 256 that generates access commands and other control information for accessing data and error information stored in the memory devices 120. The commands include address information that correspond to the location of the data and error information in the memory devices 120. The host logic circuit 256 provides the commands to an interface circuit 250, which transmits the commands to the memory module 110 via PCA link 154. The host logic circuit 256 also transmits and receives data from the memory module 110 via the PDQ links 150 and interface 250. Generally speaking, any operations described herein as being performed by the memory controller 104 are understood to be performed by the host logic 256 and/or the interface circuit 250.

The memory module 110-1 includes a memory buffer 102-1 and several memory devices 120. The memory devices 120 are organized into ranks, which are in turn organized into rank groups, such as Rank Group 0 and Rank Group 1. The ranks of memory devices 120 in each rank group are independently addressable from the ranks of memory devices 120 in the other rank group(s). Ranks of devices 120 in Rank Group 0 receive commands from the buffer 102-1 via a secondary command/address bus (SCA0) 202 and transfer data with the buffer 102-1 via a secondary data bus (SDQ0) 206. Ranks of devices 120 in rank group 1 receive commands from the buffer 102-1 via secondary command/address bus (SCA1) 204 and transfer data with the buffer 102-1 via secondary data bus (SDQ1) 208.

In one embodiment, the memory devices 120 are controlled by independent chip select signals. For example, chip select signals SCA0_CS[7:0] are independently connected to each of the memory devices 120 in rank group 0. Chip select signals SCA1_CS[7:0] are independently connected to each of the memory devices 120 in rank group 1. Selected devices 120 will respond to incoming commands from the memory buffer 102-1, whereas de-selected devices 120 will ignore incoming commands. The use of independent chip select signals allows one rank of memory devices to be selected for receiving a command while de-selecting the other rank of memory devices in the same rank group. Further, the use of independent chip select signals allows one or more memory devices 120 within a single rank of memory to be selected for receiving a command while de-selecting remaining devices in the same rank. For example, when accessing ECC, the chip select signals may be selectively asserted to select one or more memory devices 120 in a rank of memory devices 120.

The memory buffer 102-1 includes several interface circuits for communicating signals with the memory controller 104 and memory devices 120. The memory buffer 102-1 communicates with the memory controller 104 via interface 294. The memory buffer 102-1 communicates with memory devices 120 in Rank Group 0 via interface 290. The memory buffer 102-1 communicates with memory devices 120 in Rank Group 1 via interface 292.

The memory buffer 102-1 also includes a buffer control circuit 240. In one embodiment, the buffer control circuit 240 receives one or more access commands from the memory controller 104 via the interface 294 and PCA link 154. The access command(s) include a primary memory address that is used for accessing data and ECC from the memory devices 120. The buffer control circuit 240 decodes the primary address into multiple secondary addresses for accessing the data and the ECC associated with the data. Secondary addresses for accessing the data are referred to herein as data addresses. Secondary addresses for accessing the ECC are referred to herein as error addresses. Various embodiments for decoding the primary address into secondary addresses are explained in conjunction with FIGS. 5A-5D.

The secondary addresses may be provided to the memory devices via SCA0 202 and SCA1 204 for accessing data and the ECC for the data. In one embodiment, the memory buffer 102 accesses data from a rank of memory devices in a first rank group (e.g., rank group 0) with one or more data addresses while accessing ECC corresponding to the accessed data from one or more memory devices from a rank of memory in a second rank group (e.g., rank group 1) with an error address. This embodiment is explained in greater detail in conjunction with FIG. 3A and 3B. Other embodiments for accessing data and ECC are explained in conjunction with FIGS. 6 and 7.

The memory devices 120 transmit the data and ECC located at the specified data and error addresses to the control circuit 240 via the secondary data buses 206 and 208 and interface circuits 290 and 292. The buffer control circuit 240 performs an EDC operation on the data and ECC bits to determine if the data contains any errors. If the data contains no errors, the buffer control circuit 240 transmits the data to the memory controller 104 via the PDQ 150 links. If the data contains a correctable error, the buffer control circuit 240 corrects the error and transmits the corrected data to the memory controller 104 via interface 294 and PDQ links 150. If the data contains an uncorrectable error, the buffer control circuit 240 transmits the uncorrected data to the memory controller 104. In one embodiment, the control circuit 240 can indicate the presence of an error to the memory controller 104 by transmitting an indication of the error. For example, the control circuit 240 may assert a data mask signal that is part of the PDQ link 150 or assert a sideband signal that is part of the PCA link 154 to indicate the presence of an error in the read data. Beneficially, handling EDC operations in a memory buffer 102-1 enables EDC capabilities to be added to systems 100 that have traditionally used non-EDC memory controllers 104 with little or no modification to the memory controller 104.

Write accesses are performed similar to read accesses. For write accesses, the buffer control circuit 240 receives a primary address from the memory controller 104 via the PCA link 154 and decodes the address into multiple secondary addresses (e.g., data and error addresses). The buffer control circuit 240 also receives data from the memory controller 104 via the PDQ links 150 and generates the ECC for the data. The buffer control circuit 240 stores the received data into the memory devices 120 using the data addresses. The control circuit 240 also stores the ECC for the data into the memory devices 120 using the error addresses.

In one embodiment, EDC coverage is optional, meaning that not all data accesses will have ECC associated with them. In one embodiment, EDC coverage is statically enabled for all memory accesses. During system startup, the memory controller 104 may transmit an indication to the memory buffer 102 to treat all data access commands as having EDC coverage. The indication may be, for example, a separate command that is transmitted on the PCA 154 link. Upon receiving the indication, the memory buffer 102-1 treats all subsequent data access commands as having EDC coverage.

In another embodiment, the EDC coverage is determined on a per access basis. The memory controller 104 indicates to the buffer 102-1 with each data access transaction whether or not the data has associated EDC coverage. This indication may be, for example, a flag in an access command for the data (e.g., a specific bit or op-code), or an address in the access command that falls within a particular address range that is pre-determined to be associated with EDC coverage. If the buffer 102-1 determines from the indication that that the data for the access has EDC coverage, the buffer 102-1 attempts to access the ECC corresponding to the data. If the buffer 102-1 determines that the data for the access does not have EDC coverage, the buffer 102-1 does not access any ECC corresponding to the data In one embodiment where the indication is an address that falls in a pre-determined address range associated with EDC coverage, the pre-determined address is programmable. For example, the buffer control circuit 240 may have a register (not shown) that can be set to different modes. In a first mode, EDC coverage is disabled for all row addresses, effectively disabling EDC coverage. In a second mode, EDC coverage is enabled for all row addresses. In a third mode, EDC coverage is enabled for half the row addresses that fall within a particular row address range (e.g., addresses beginning with the bit "1"). In a fourth mode, EDC coverage is enabled for a quarter of the row addresses that fall within a particular row address range (e.g., addresses beginning with the bits "11"). The memory controller 104 can set the register, for example, by generating the settings in the host logic circuit 256 and then transmitting the address range settings to the memory buffer 102-1 via the interface 250 and PCA link 154 using a command that sets the register to a particular mode.

In another embodiment, a smaller portion of the address space is allotted for ECC than is needed for full address space coverage. The memory buffer 102-1 remaps the incoming memory address from the memory controller 104 to the space allotted for ECC or to space that is not allotted for ECC depending on the access command. The mapping can be stored in a look-up table that specifies the mapping between the incoming addresses and the actual addresses of the memory devices 120. This embodiment is particularly applicable to non-volatile memory that uses address re-mapping to address levelization concerns.

Figure 3A:
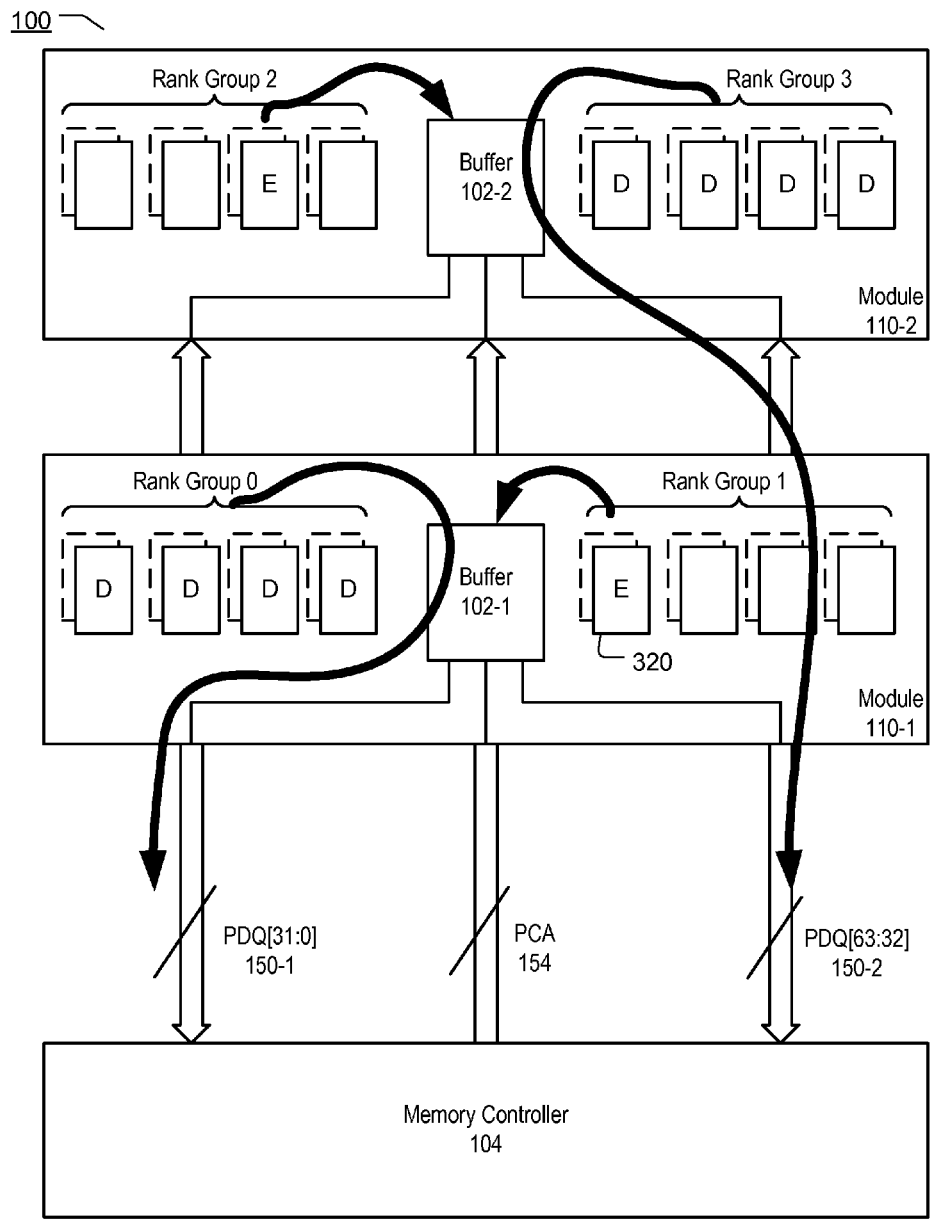
FIGS. 3A and 3B illustrate providing EDC coverage in the memory system of FIG. 1, according to one embodiment.
Figure 3B:
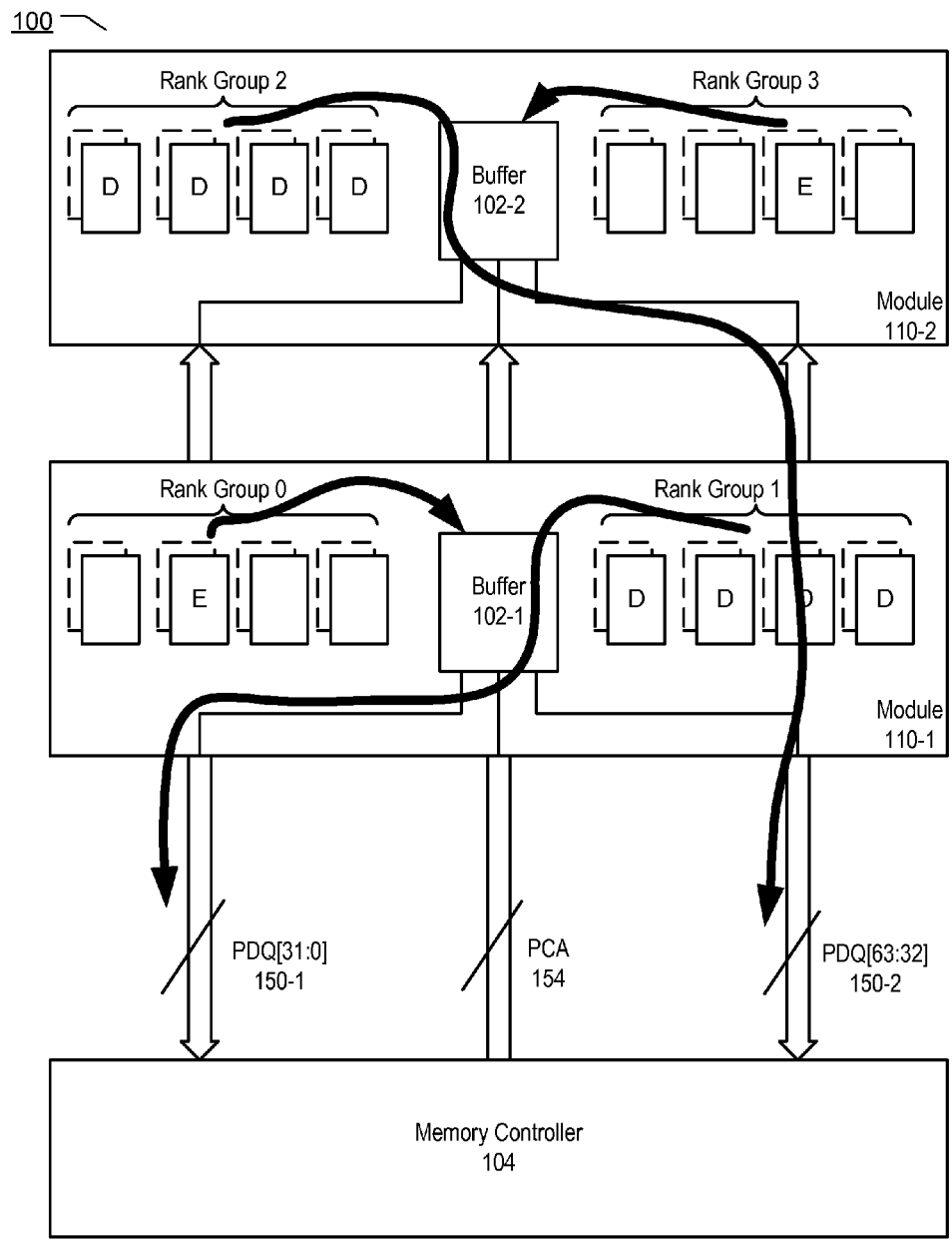

FIG. 3A and 3B illustrate providing EDC coverage for the memory system of FIG. 1 according to one embodiment. FIG. 3A and 3B show that, for each data access transaction, the data and ECC for the data are accessed from different rank groups. The memory accesses shown in FIG. 3A and 3B are also meant to represent a series of memory accesses. In other words, the memory accesses in FIG. 3A are preceded or followed by the memory accesses in FIG. 3B.

Referring to FIG. 3A, shown is the memory system 100 of FIG. 1 that includes two memory modules 110 and a memory controller 104. The memory controller 104 sends one or more commands to memory buffer 102-1 of memory module 110-1 via the PCA link 154 for accessing data from the memory devices of memory module 110-1. The command(s) include a primary address that the memory buffer 102-1 decodes into multiple secondary addresses. One or more of the secondary addresses is used for accessing data from Rank Group 0. The location of the data for this data access is indicated with the letter "D". At the same time, one or more of the secondary addresses is used for accessing ECC from a single memory device 320 in Rank Group 1. The location of the ECC for this data access is indicated with the letter "E". To reduce power consumption during the ECC access, the chip select signal (not shown) for the memory device 320 storing the ECC may be asserted while the chip select signals for the remaining memory devices in Rank Group 1 may be de-asserted. The memory buffer 102-1 checks the data retrieved from Rank Group 0 against the ECC retrieved from rank group 1 to detect and correct any data errors. The resulting data is then transmitted to the memory controller 104 via PDQ link 150-1.

Accessing the data in the first module 110-1 only consumes half the memory bandwidth available on the PDQ links 150. To make use of all the available bandwidth (i.e., both PDQ [31:0] link 150-1 and PDQ[63:32] link 150-2), the memory controller 104 also sends one or more commands to memory buffer 102-2 of module 110-2 via the PCA link 154 for accessing data from the memory devices of module 110-2. The command(s) include a primary address that the buffer 102-2 decodes into multiple secondary addresses. One or more of the addresses is used for accessing data from rank group 3. At the same time, one or more of the addresses is used for accessing ECC from a single memory device in rank group 2. Memory buffer 102-2 checks the data retrieved from rank group 3 against the ECC retrieved from rank group 2 to detect and correct any data errors. The resulting data is then transmitted to the memory controller 104 via PDQ link 150-2. In one embodiment, the commands transmitted by the memory controller 104 to the two memory modules 110-1 and 110-2 follow close in time to each other so that the full bandwidth of the PDQ link 150 is utilized.

FIG. 3B is similar to the system in FIG. 3A and shows different data access transactions that occur either before or after the data access transactions in FIG. 3A. In FIG. 3B, the memory controller 104 sends one or more commands to memory buffer 102-1 of memory module 110-1 via the PCA link 154 for accessing data from the memory devices of memory module 110-1. The command(s) includes an address that the buffer 102-1 decodes into multiple secondary addresses. One or more of the addresses is used for accessing data from Rank Group 1. At the same time, one or more of the addresses is used for accessing ECC from a single memory device in Rank Group 0. The memory buffer 102-1 checks the data retrieved from Rank Group 0 against the ECC retrieved from Rank Group 1 to detect and correct any data errors. The resulting data is then transmitted to the memory controller 104 via PDQ link 150-1.

The memory controller 104 also sends one or more commands to buffer 102-2 of module 110-2 via the PCA link 154 for accessing data from the memory devices of module 110-2. The command(s) include an address that the buffer 102-2 decodes into multiple secondary addresses. One or more of the addresses is used for accessing data from Rank Group 2. At the same time, one or more of the addresses is used for accessing ECC from a single memory device in Rank Group 3. The memory buffer 102-2 checks the data retrieved from rank group 2 against the ECC retrieved from Rank Group 3 to detect and correct any data errors. The resulting data is then transmitted to the memory controller 104 via PDQ link 150-2.

Figure 4A:
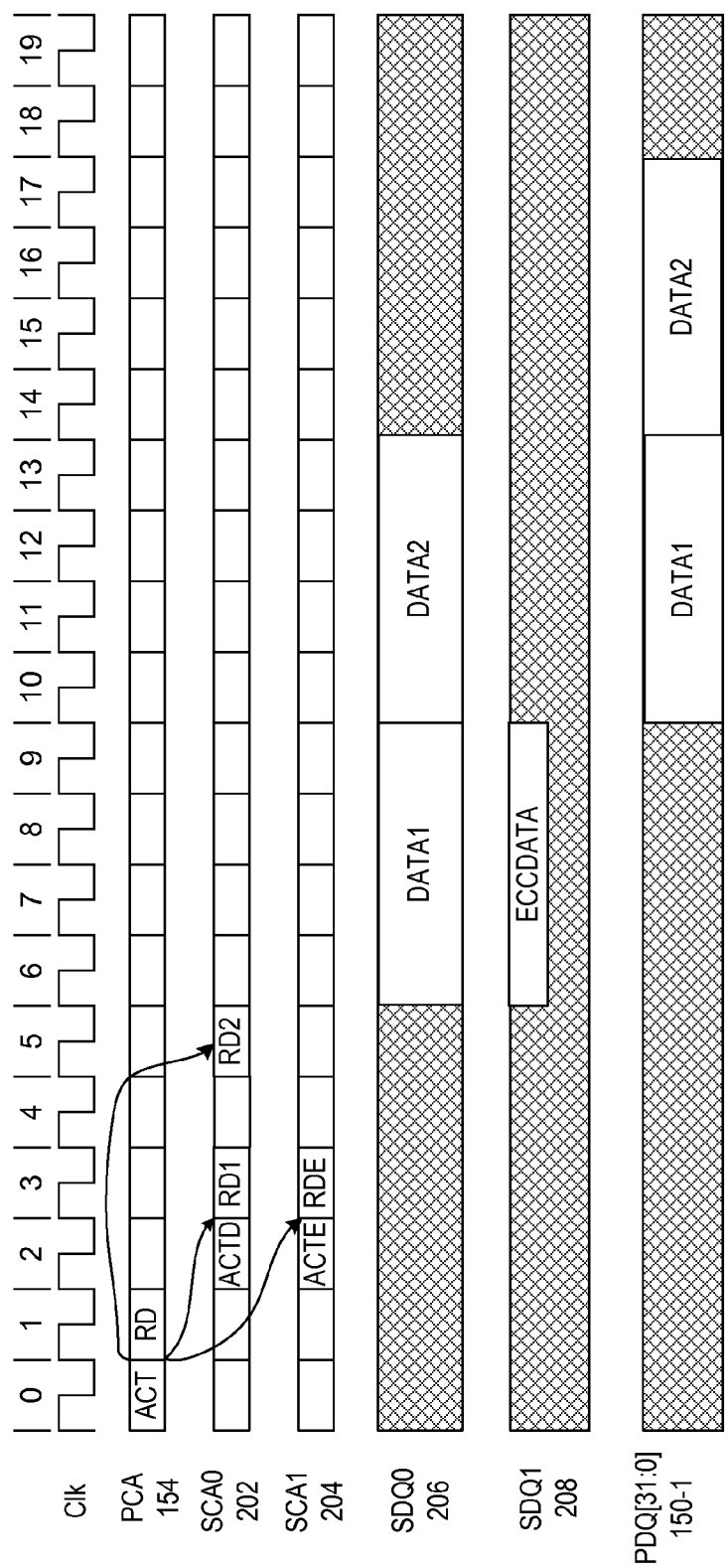
FIGS. 4A and 4B are timing diagrams for the memory accesses as shown in FIGS. 3A and 3B, respectively, according to an embodiment.
Figure 4B:
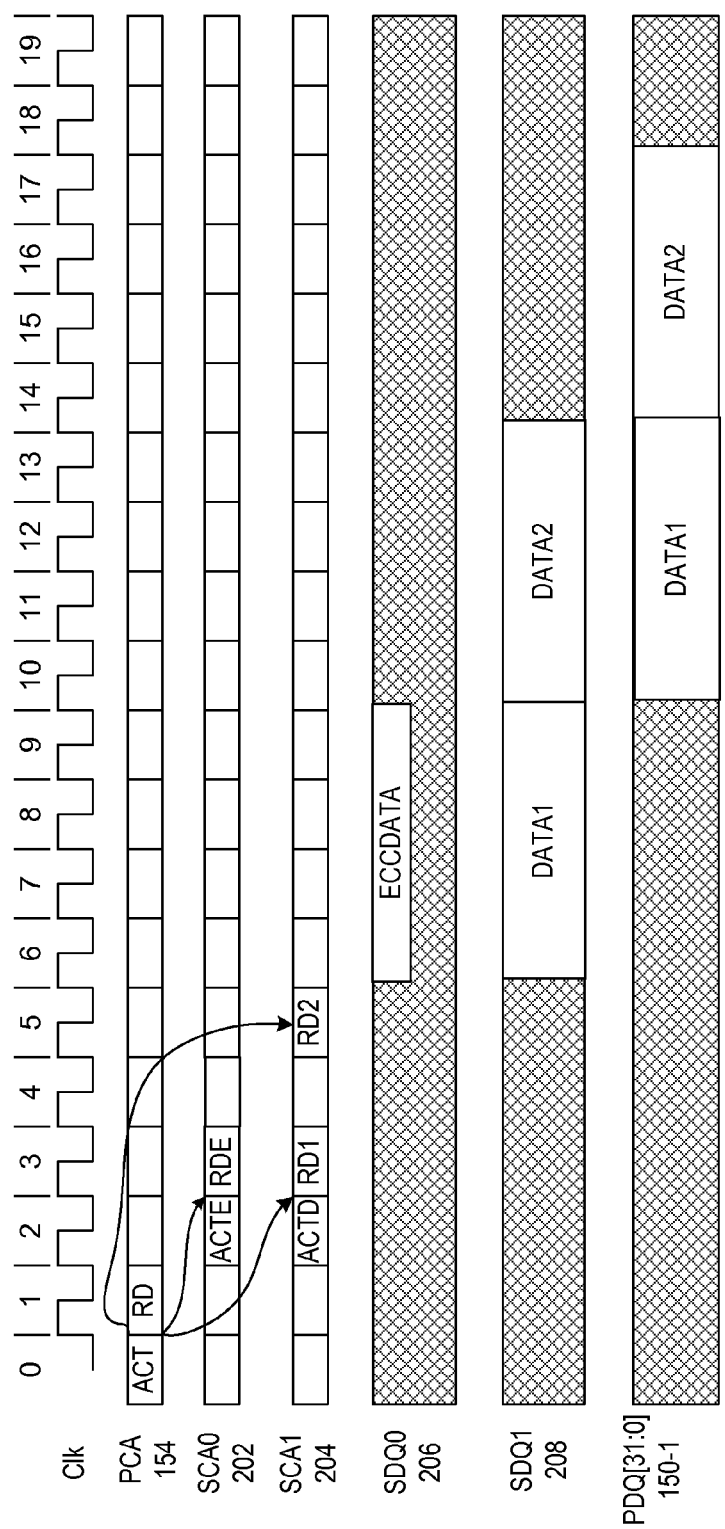

FIG. 4A and 4B are timing diagrams for the memory accesses in FIG. 3A and 3B, respectively. Specifically, FIG. 4A shows how the memory controller 104 accesses data from memory module 110-1 in FIG. 3A. FIG. 4B shows how the memory controller 104 accesses data from memory module 110-1 in FIG. 3B. Timing diagrams are not shown for the memory access transactions between the memory controller 104 and the other memory module 110-2, although the timing for these transactions is similar to the timing shown in FIG. 4A-4B for memory module 110-1. FIGS. 4A and 4B are explained in conjunction with FIG. 2 and FIGS. 3A and 3B.

In FIG. 4A, the memory controller 104 transmits to the memory buffer 102, via the PCA 154 link, a primary activate command (ACT) followed by a primary read command (RD). An activate command includes a row address and is intended to activate a specified row of a particular bank of memory in preparation for a data access. A read command includes a column address and is intended to read data from a specified column of the activated row. Both commands also include a bank address for selecting a particular bank of memory and chip select information for selecting one or more memory devices that the commands are intended for.

The memory buffer 102-1 of the memory module 110-1 decodes the address information (bank, row, column, and chip select addresses) specified by the received commands into secondary addresses. The secondary addresses are used to retrieve data and ECC from the memory devices 120. Specifically, ACT and RD are decoded into two data addresses that are used to generate data activate (ACTD) and data read (RD1 and RD2) commands. The commands are transmitted to devices in Rank Group 0 via the SCA0 202 link for retrieving data. One rank of memory devices 120 in Rank Group 0 responds to the RD1 command by providing data (DATA1) on the SDQ0 206 link. The same rank of memory devices in Rank Group 0 responds to the RD2 command by providing data (DATA2) on the SDQ0 206 link.

ACT and RD are also decoded into an error address that is used to generate ECC activate (ACTE) and ECC read (RDE) commands. The ACTE and RDE commands are transmitted to devices in Rank Group 1 via the SCAT 204 link for retrieving ECC information. One of the memory devices (e.g., device 320 in FIG. 3A) in a rank of Rank Group 1 responds to the RDE command by providing the ECC for the data (ECCDATA) via the SDQ1 208 link. In one embodiment, the chip select signals are only asserted to a single device that stores the ECCDATA associated with DATA1 and DATA2. Only the selected device will respond to the RDE command by providing the ECCDATA on the SDQ1 link while the remaining devices in Rank Group 1 will not transmit any information on the SDQ1 link.

The memory buffer 102-1 receives DATA1, DATA2, and ECCDATA from the memory devices 120 and checks DATA1 and DATA2 for errors using ECCDATA. In the embodiment of FIG. 4A, each set of access commands (ACT and RD) received via the PCA 154 link results in two 32 bit data accesses with all the memory devices in Rank Group 0, and a single 8 bit ECC access with a single device in Rank Group 1. Thus, 8 bits of ECC is accessed for every 64 bits of data, which is the precise amount of ECC that is necessary for performing single bit detect double error detect (SBC-DED) processing.

If no errors exist, the buffer 102-1 then transmits DATA1 and DATA2 to the memory controller 104 via PDQ link 150-1. If an error does exist, the buffer 102-1 may correct the error and/or transmit an indication to the memory controller 104 that an error was detected.

In other embodiments, two primary read commands may be received via the PCA link 154 as opposed to a single primary read command. The first primary read command is decoded into the RD1 command and the second primary read command is decoded into the RD2 command. Only one of the two primary read commands is decoded into the RDE command for the ECC access, whereas the other primary read command does not result in an 8 bit ECC access. Each primary read command includes a flag in the command indicating whether the command spawns an ECC access, which is used by the buffer 102-1 to determine how to decode the received command. In other embodiments, the buffer may be configured to treat every other read access command as being associated with ECC.

In another embodiment where two primary read commands are received, the read commands are decoded into two data read commands (e.g., RD1 and RD2) and two ECC read commands. Each secondary data read command results in an 8-bit burst length data access, but each ECC read command results in only a 4-bit burst length ECC access instead of an 8-bit burst length ECC access. In this case, there are still 8 bits of ECC retrieved for every 64 bits of data. Which 4-bits of the default 8-bit burst length include the ECC data is determined by remapping one column bit of the primary read address. In one embodiment, DRAM reordering and burst-chop are used to truncate the access to the error information so that the correct bits of error information are transferred.

FIG. 4B is a timing diagram for the memory accesses in FIG. 3B according to an embodiment. Specifically, the timing diagram shows how the memory controller 104 accesses data from memory module 110-1. FIG. 4B is similar to FIG. 4A except that data addresses are now transmitted via the SCA1 204 link and error addresses are transmitted onto the SCA0 202 link. Specifically, the memory buffer 102-1 decodes ACT and RD commands into ACTE and RDE commands that are transmitted to Rank Group 0 via the SCA0 202 link. In response to receiving the RDE command, a selected memory device in Rank Group 0 transmits ECCDATA to the memory buffer 102-1 via the SDQ0 link.

The memory buffer 102-1 also decodes the ACT and RD commands into ACTD, RD1, and RD2 commands that are transmitted to Rank Group 1 via the SCA1 link. In response to receiving the RD 1 and RD2 commands, a rank of memory devices 120 in Rank Group 1 transmits DATA1 and DATA2 to the memory buffer 102-1 via the SDQ1 link. DATA1 and DATA2 are checked for errors against ECCDATA before being transmitted to the memory controller 104 via the PDQ [31:0] 150-1 link.

FIG. 5A, 5B, 5C, and 5D illustrate decoding a received memory address into secondary addresses according to various embodiments of the memory buffer. FIGS. 5A-5D are explained in conjunction with FIG. 1 and FIG. 2. In one embodiment, the decoding operations are performed by the memory buffer 102-1 in response to receiving an address from the memory controller 104 via the PCA link 154. The buffer 102-1 decodes the address and uses the decoded address to transmit secondary access commands to the memory devices 120 via the SCA0 202 and SCAT links 204 for data and ECC access.

Figure 5A:
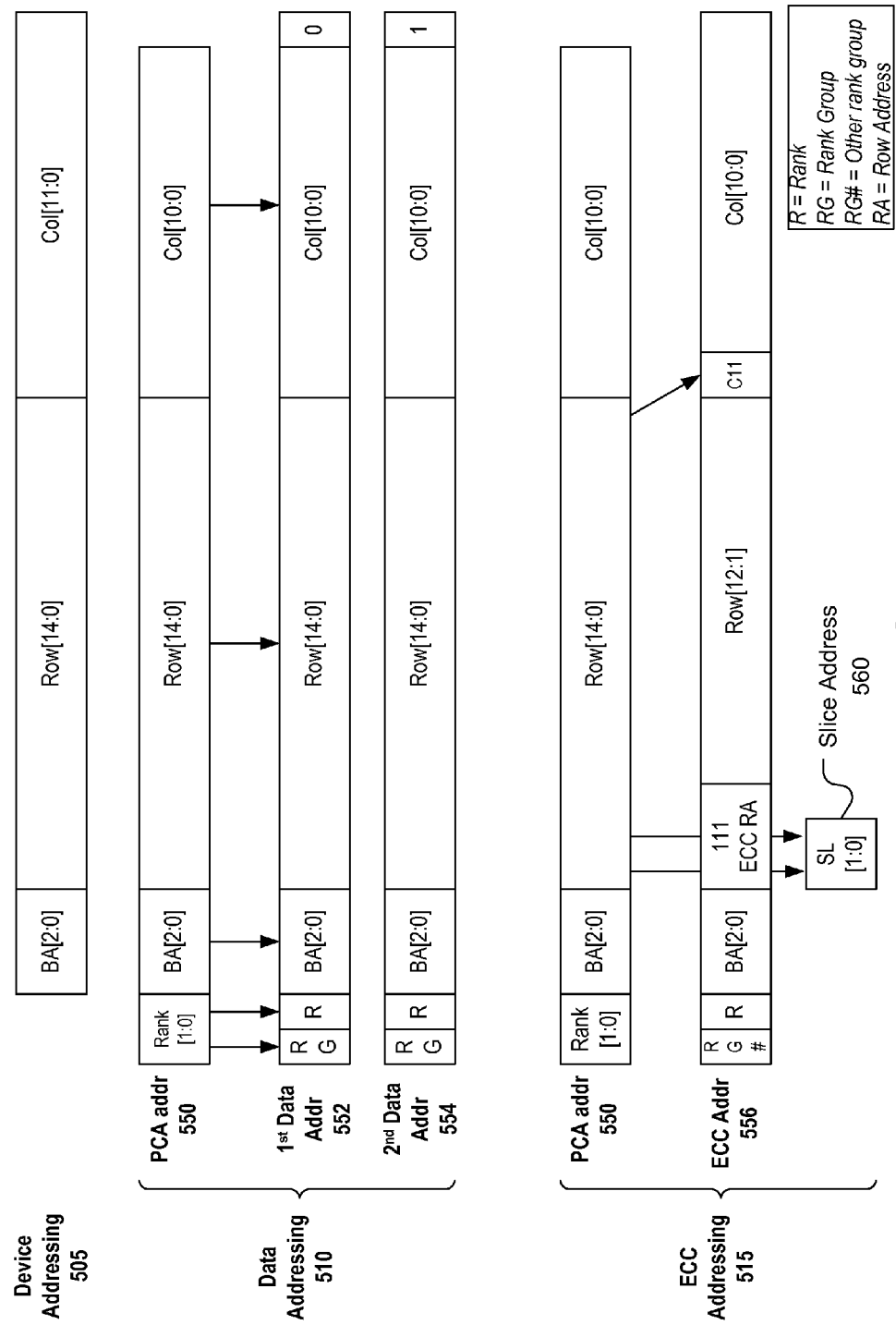
FIGS. 5A, 5B, 5C, and 5D illustrate decoding a primary memory address into secondary addresses, according to various embodiments.

FIG. 5A illustrates decoding a received memory address into secondary addresses according to a first embodiment of the memory buffer. Initially, the addressing requirements of a memory device 120 are first explained. Information (e.g., Data or ECC) stored in a memory device 120 is accessed with a memory address 505 that is provided as part of read or write command(s). In one embodiment, a device address 505 includes a three bit bank address (BA[2:0]), a fifteen bit row address (Row[14:0]), and a twelve bit column address (Col [11:0]). In other embodiments, the device address 505 may include a different number of address bits. A memory device 120 is also accessed with a chip select signal that either selects the device or de-selects the device. A selected device will respond to incoming commands, whereas a de-selected device will not respond to incoming commands.

Still referring to FIG. 5A, data addressing 510, which is how a received address 550 is decoded into data addresses (e.g., 552 and 554) for accessing data from the memory devices 120, is now explained. The PCA address 550 represents address information received by the buffer 102-1 via the PCA link 154. The PCA address 550 includes a three bit bank address (BA[2:0]), a fifteen bit row address (Row[14:0]), and an eleven bit column address (Col[10:0]). The PCA address 550 also includes two rank bits (Rank[1:0]) that represent the binary-encoded equivalent of the chip select signals in the PCA link 154 (i.e., four chip select signals can be represented by a two bit binary value).

The PCA address 550 is decoded into two data addresses 552 and 554 for accessing data in the memory devices 120. Specifically, the Rank[1] bit is used to select a rank group for data access. The Rank[0] bit is used to select a rank within the selected rank group for the data access. The values of these two bits are used to determine how to assert the chip select signals for the various ranks and rank groups. For example, if the Rank[0] and Rank[1] bits both have a value of "0", the chip selects for a rank of devices 120-1 of Rank Group 0 may be asserted. As another example, if the Rank[0] and Rank[1] bits are both have a value of "1", the chip selects for a rank of devices 120-4 in Rank Group 1 may be asserted.

The three bank bits of the PCA address 550 are directly mapped to the bank bits of the data addresses 552 and 554. The fifteen row bits of the PCA address 550 are directly mapped to the row bits of the data addresses 552 and 554. The eleven column bits of the PCA address 550 are mapped to the most significant column bits of the data addresses 552 and 554. The least significant column bit for the first data addresses 552 is filled with the bit value "0". The least significant column bit for the second data address 554 is filled with the bit value "1". Decoding the first 552 and second data addresses 554 in this manner ensures that data is read from different column addresses.

Still referring to FIG. 5A, ECC addressing 515, which is how a received address 550 is decoded into an ECC address 556 for accessing ECC from the memory devices, is now explained. As shown, the same PCA address 550 used to generate the data addresses 552 and 554 is also decoded into an ECC address 556. Specifically, the Rank[0] bit is used to select a rank for the ECC access. The Rank[1] bit is inverted and used to select a rank group for the ECC access. Inverting the Rank[1] bit means that the ECC is mapped to a different rank group than its associated data. Additionally, the two most significant row bits in the PCA address 550 are treated as a slice address 560 that is decoded into per-device chip select signals. The per-device chip selects are used to select one of the four devices in the selected rank and rank group for the ECC access.

The Row[0] bit of the PCA address 550 is mapped to the Col[11] bit of the ECC address 556. The column bits of the PCA address 550 are mapped to the least significant column bits of the ECC address 556. The three bank bits BA[2:0] of the PCA address 550 are mapped to the bank bits BA[2:0] of the ECC address 556. The Row[12:1] bits of the PCA address 550 are mapped to the least significant row bits of the ECC address 556. The three most significant row bits of the ECC address 556 are filled with the default value "111." Filling the row bits with a default value effectively reserves these particular row addresses for ECC.

Figure 5B:
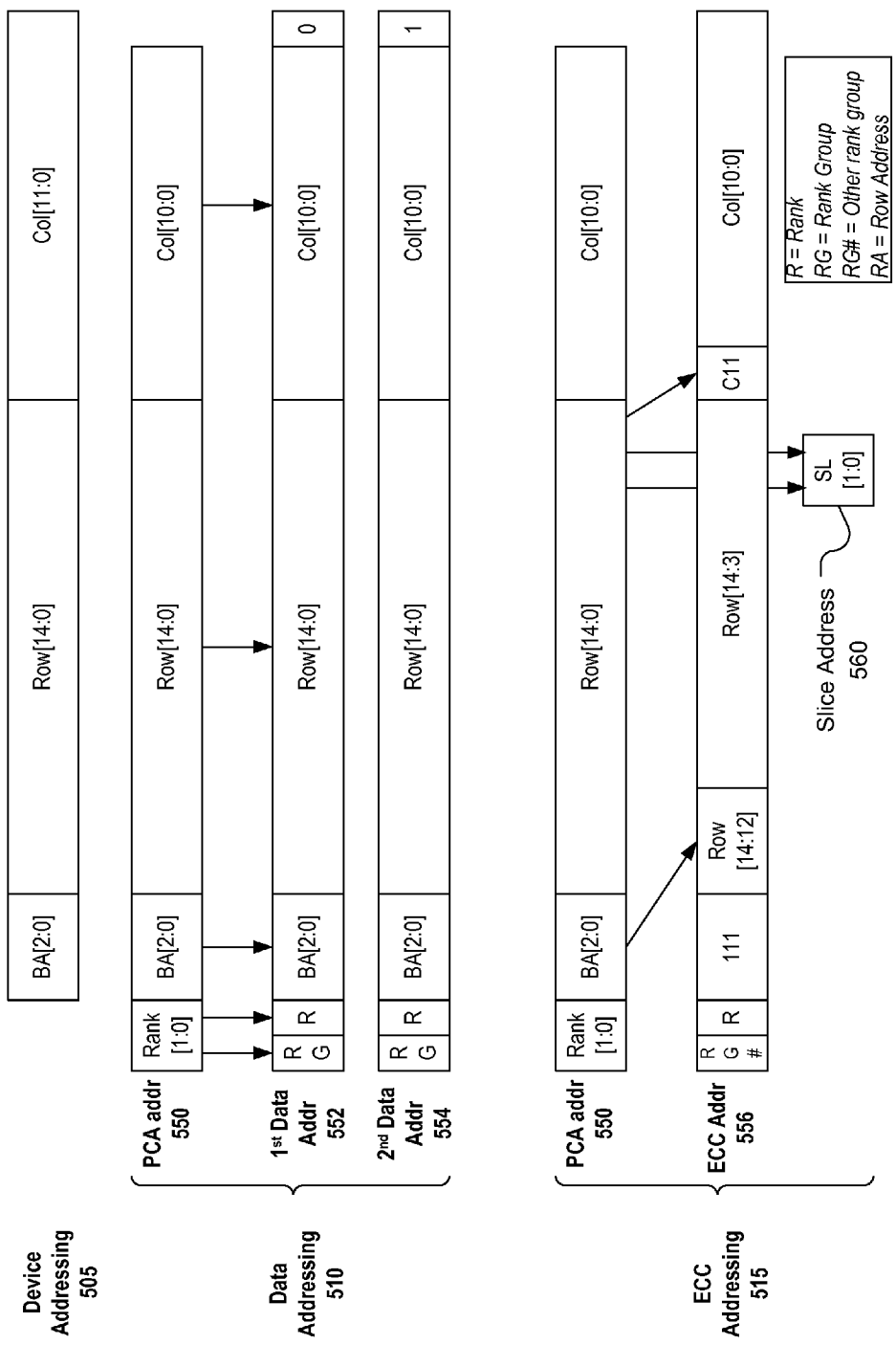

FIG. 5B illustrates decoding a received memory address 550 into secondary addresses according to a second embodiment of the memory buffer. The embodiment in FIG. 5B is similar to the embodiment in FIG. 5A, except that the ECC addressing 515 in FIG. 5B is different than the ECC addressing in FIG. 5A. As shown, the Row[2:1] bits are now decoded into per-device chip selects that are used to select one of the four devices in the selected rank and rank group for the ECC access. The bank bits BA[2:0] of the PCA address 550 are mapped into the most significant row bits Row[14:12] of the ECC address 556. The Row[14:3] bits of the PCA address 550 are mapped into the least significant row bits of the ECC address 556. The bank bits of the ECC address 556 are filled with the default value "111." Filling the bank bits with a default value effectively reserves these particular bank addresses for ECC.

Figure 5C:
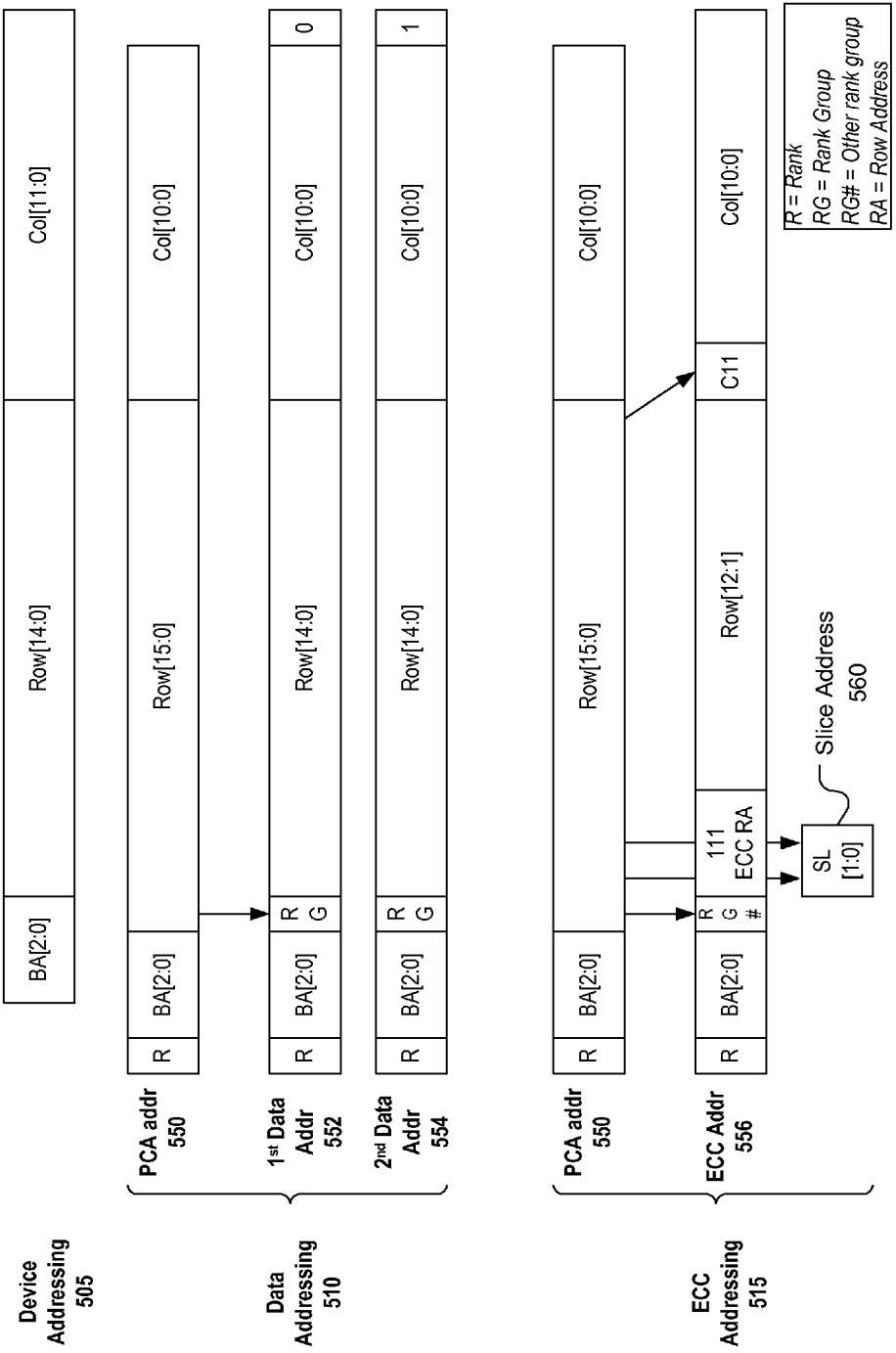

FIG. 5C illustrates decoding a received memory address into secondary addresses according to a third embodiment of the memory buffer. The embodiment in FIG. 5C is similar to the embodiment in FIG. 5A. However, the PCA address 550 now includes only a single rank bit and the row address includes an additional row bit for a total of sixteen row bits.

During data addressing 510, the Row[15] bit of the PCA address 550 is now used to select a rank group for data access. The single rank bit of the PCA address 550 is used to select a rank of the selected rank group for data access. The remaining Row[14:0] bits in the PCA address 550 are mapped to the Row bits for the data addresses 552 and 554. The mapping of the bank BA[2:0] and column addresses remain unchanged from the embodiment of FIG. 5A.

During ECC addressing 515, the Row[15] bit of the PCA address 550 is inverted and used to select a rank group for ECC access. The Row[14:13] bits in the PCA address 550 are decoded 560 into per-device chip selects that are used to select one of the four devices in the selected rank and rank group for the ECC access. The Row[12:1] bits of the PCA address 550 are mapped to the least significant row bits of the ECC address 556. The most significant row bits of the ECC address 556 are filled with the default value of "111."

This embodiment is beneficial for simplifying scheduling by removing inter-rank group dependencies that are not expected by existing memory controllers 104. A controller 104 that is not fully aware of how ECC is being accessed does not account for data accesses to a bank in Rank Group 0 also resulting in a row being opened in a device of Rank Group 1 for ECC. The controller 104 may later attempt to open the row storing the ECC data even though it was already opened for an ECC access. The memory address mapping of FIG. 5C removes this concern. The memory controller 104 is only tracking two ranks of memory devices, so rank grouping is effectively disabled from the controller's perspective. Any data access to bank 0 of rank 0 in Rank Group 0 will effectively block out accesses to bank 0 of rank 0 in Rank Group 1 as well.

Figure 5D:
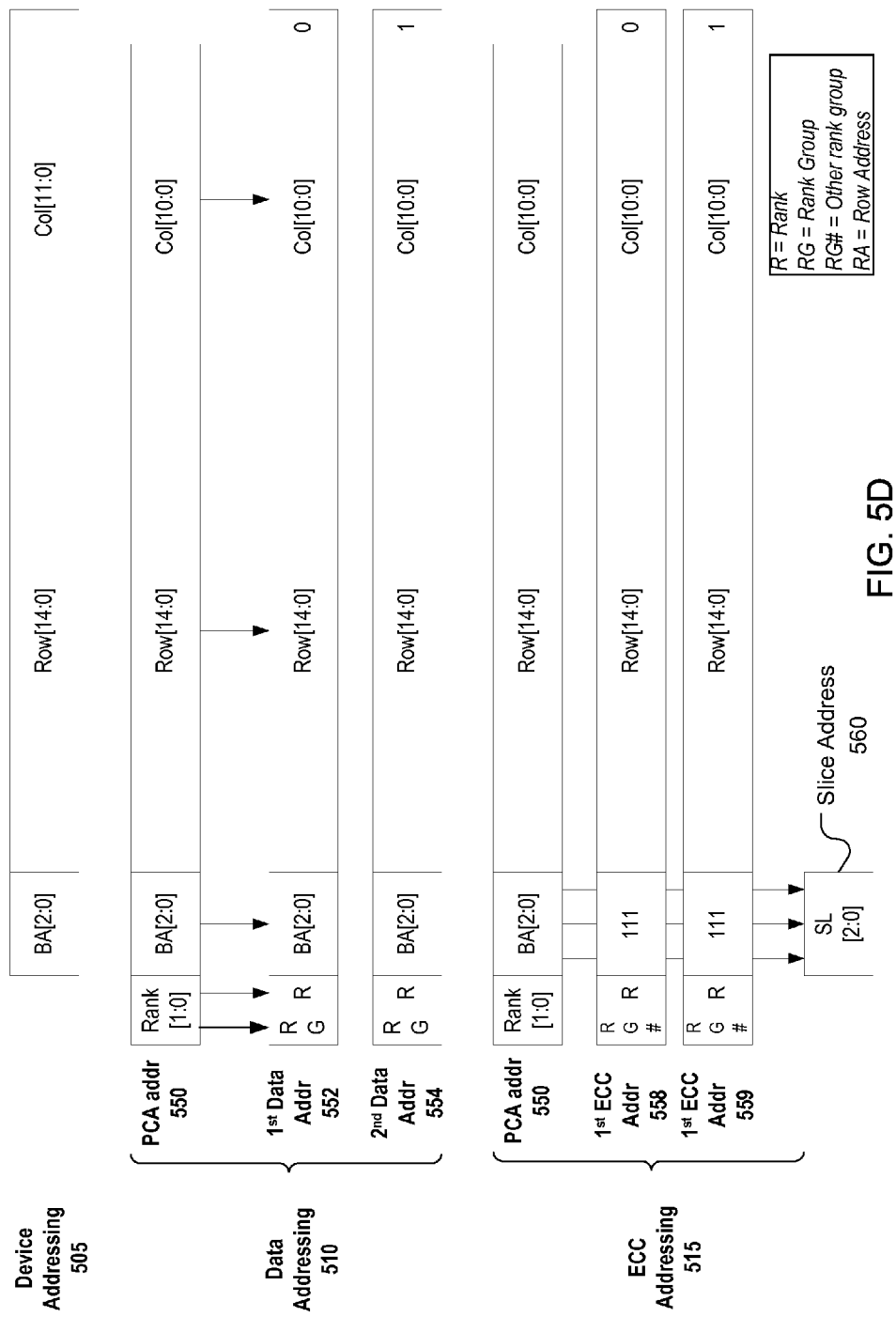

FIG. 5D illustrates decoding a received memory address into secondary addresses according to a fourth embodiment of the memory buffer. The embodiment shown in FIG. 5D is intended to operate with modules 110 that have x4 memory devices 120. In one embodiment, a module 110 with x4 memory devices 120 has a total of thirty-two memory devices 120 divided into ranks and rank groups. Thus, each rank group has sixteen devices and each rank within a rank group has eight devices.

The data address decoding 510 in FIG. 5D is similar to the data address decoding in FIG. 5A and 5B. However, the ECC addressing is significantly different. In embodiments that have x8 devices, the ECC obtained from a single ECC access is sufficient to perform SBC-DED operations for two separate data accesses. In embodiments that have x4 devices, two ECC accesses are required to retrieve sufficient ECC to perform SBC-DED operations on the data.

During ECC addressing 515, the bank bits of the PCA address 550 are decoded into a slice address 560 that is mapped into per-device chip selects for selecting one of the eight devices in the selected rank and rank group for the ECC access. The column bits of the PCA address are mapped into the most significant column bits of the ECC addresses 558 and 559. The least significant column bit for the first ECC address 558 is filled with a "0". The least significant column bit for the second ECC address 559 is filled with a "1". The bank bits of the ECC addresses 558 and 559 are filled with the default value of "111."

Generically speaking, embodiments similar to FIG. 5D exist for memory configurations in which the number of memory devices 120 in a rank is equal to the number of banks within a memory device 120. In these embodiments, the bank address maps directly to the slice address 560 for selecting one of the memory devices 120 for the ECC access.

In the embodiments of FIG. 5A-5D, the default value for the ECC addressing 515 has been described as a 3 bit value of "111". In other embodiments, the default value may be a different bit value, for example, "000" or "001." In other embodiments, fewer or greater number of bits may be set to the default value to reduce or increase the amount of address space reserved for ECC. Additionally, although the description of FIG. 5A-5D refers to most significant and least significant bits, it is understood that the address bits may be mapped in any number of ways and is not restricted to mapping of most significant and least significant bits.

Figure 6A:
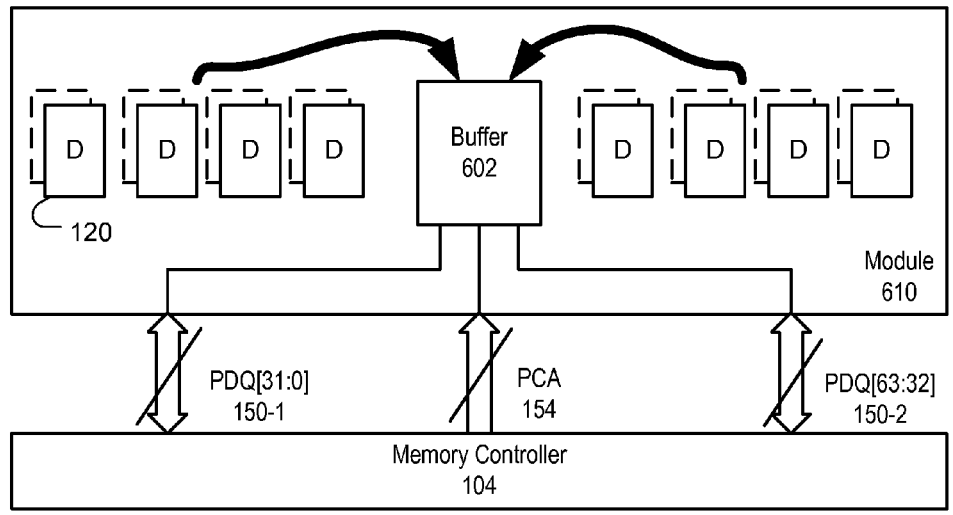
FIGS. 6A and 6B illustrate providing EDC coverage in a memory system, according to another embodiment.
Figure 6A:
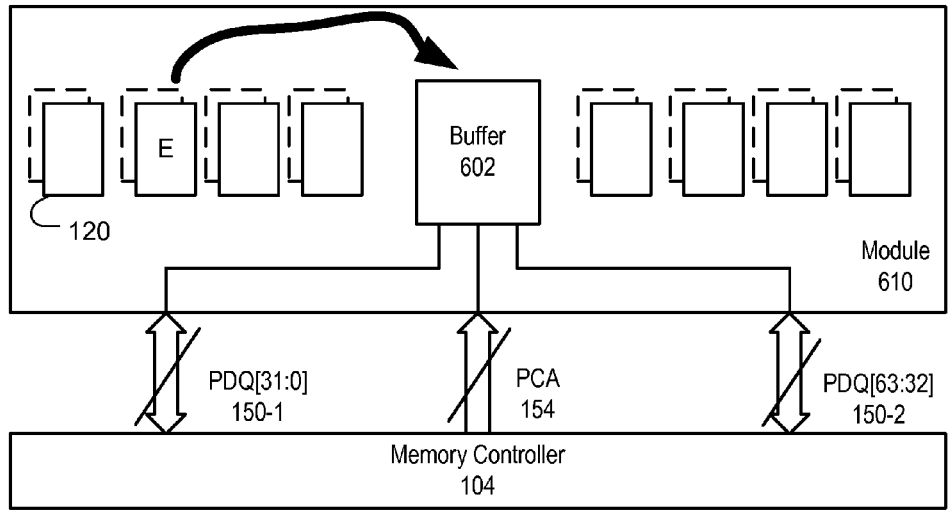

FIG. 6A illustrates ECC coverage for a memory system according to another embodiment. The embodiment in FIG. 6A is similar to the embodiment shown in FIG. 3A. However, in the embodiment of FIG. 6A, the data and the ECC are accessed in sequential steps, as indicated by step 1 and step 2. Further, memory module 610 includes only two memory ranks, and each memory rank includes eight memory devices 120. One memory rank is located on the front side of the module 610 and is indicated by solid lines. Another memory rank is located on the back side of the module 610 and is indicated by dashed lines. The module 610 of FIG. 6 does not have rank groups.

In step 1, the memory buffer 102 receives one or more data access commands from the memory controller 154 via the PCA link 154. The command(s) include a primary memory address that is decoded by the memory buffer 602 into a data address and an error address. The memory buffer 602 uses the data address to access data from an entire rank of memory devices 120 at the same time. As shown, data is accessed from each of the memory devices marked with the letter "D".

In step 2, the buffer 602 accesses ECC for the data using the ECC address. The ECC is mapped to a single memory device in the same rank that the data was accessed from. As shown, ECC is accessed from the memory devices marked with the letter "E". In other embodiments, ECC may be mapped to other devices 120 in the same rank as the data or to devices 120 in other ranks The buffer 602 performs an EDC operation on the data and transmits the resulting data to the memory controller 104 via one or both of the PDQ links 150.

Figure 6B:
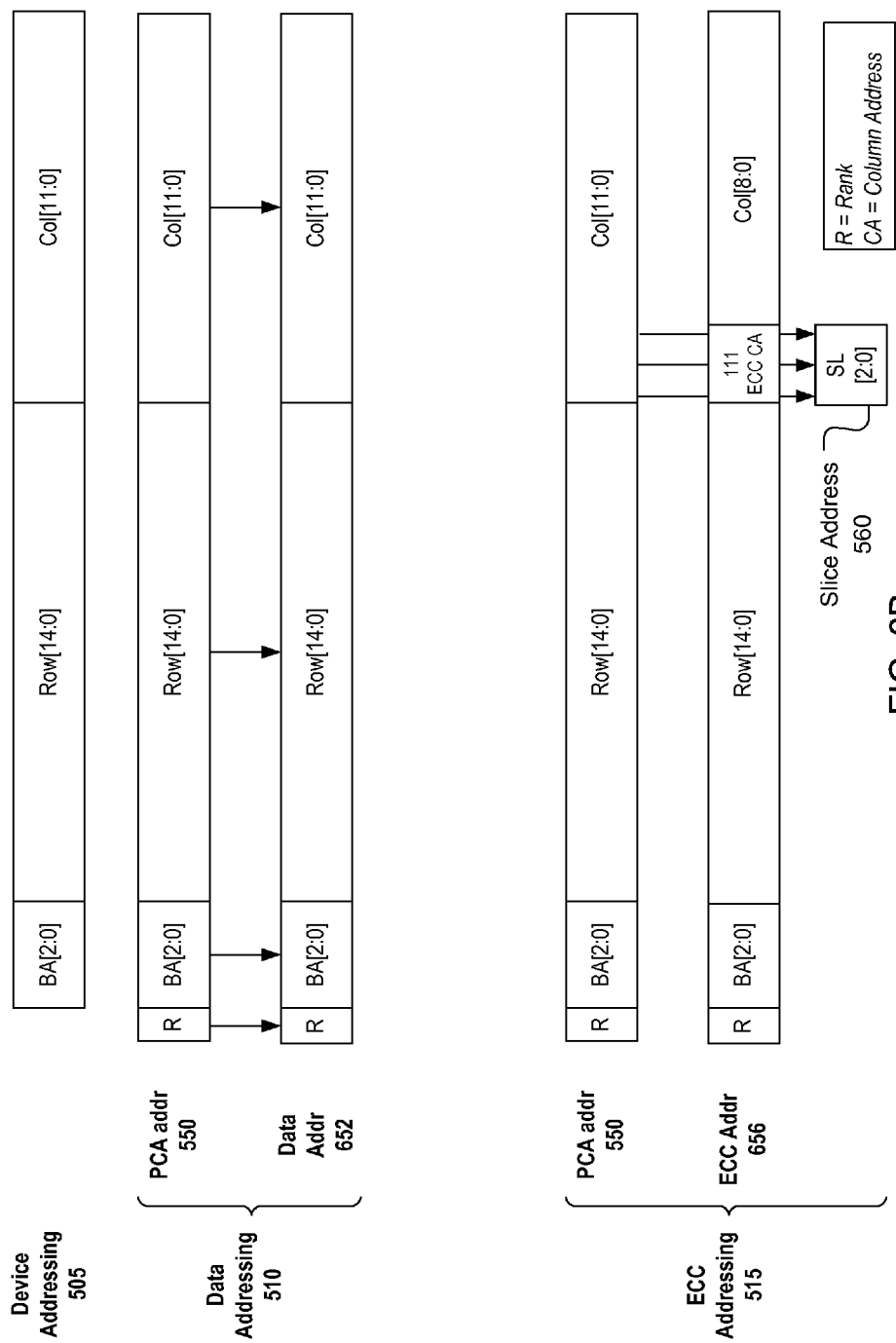

FIG. 6B illustrates decoding a received memory address into secondary addresses according to an embodiment of the memory buffer 602 of FIG. 6A. FIG. 6B is similar to the embodiments of FIG. 5A, 5B, 5C, and 5D. As shown, the PCA address 550 includes a three bit bank address (BA[2:0]), a fifteen bit row address (Row[14:0]), a twelve bit column address (Col[11:0]), and a single rank bit.

For data addressing 510, the PCA address 550 is directly mapped into a single data address 652 for accessing data in a rank of memory devices 120. For ECC addressing 515, the three most significant column bits of the ECC address 656 are filled with the default value "111." The three most significant column bits in the PCA address 550 are treated as a slice address 560 that is decoded into per-device chip select signals for selecting a memory device in the selected rank of memory devices for the ECC access.

Referring back to FIG. 6A, in one embodiment, to improve utilization of the PDQ links 150, ECC accesses may be stacked together. First, the memory buffer 602 accesses data from a full rank of memory devices 120, similar to what is shown in step 1 of FIG. 6. Second, the memory buffer 602 does two simultaneous ECC accesses to two different memory devices. For example, the buffer may access ECC from a memory device in Rank Group 0 while also accessing ECC from a memory device in Rank Group 1. Third, the ECC accesses are followed by a second full rank data access. One of the two ECC accesses is used to retrieve ECC associated with data from the first data access. The other ECC access is used to retrieve ECC associated with data from the second data access. In other embodiments, the order of these three steps may be interchanged.

Figure 7A:
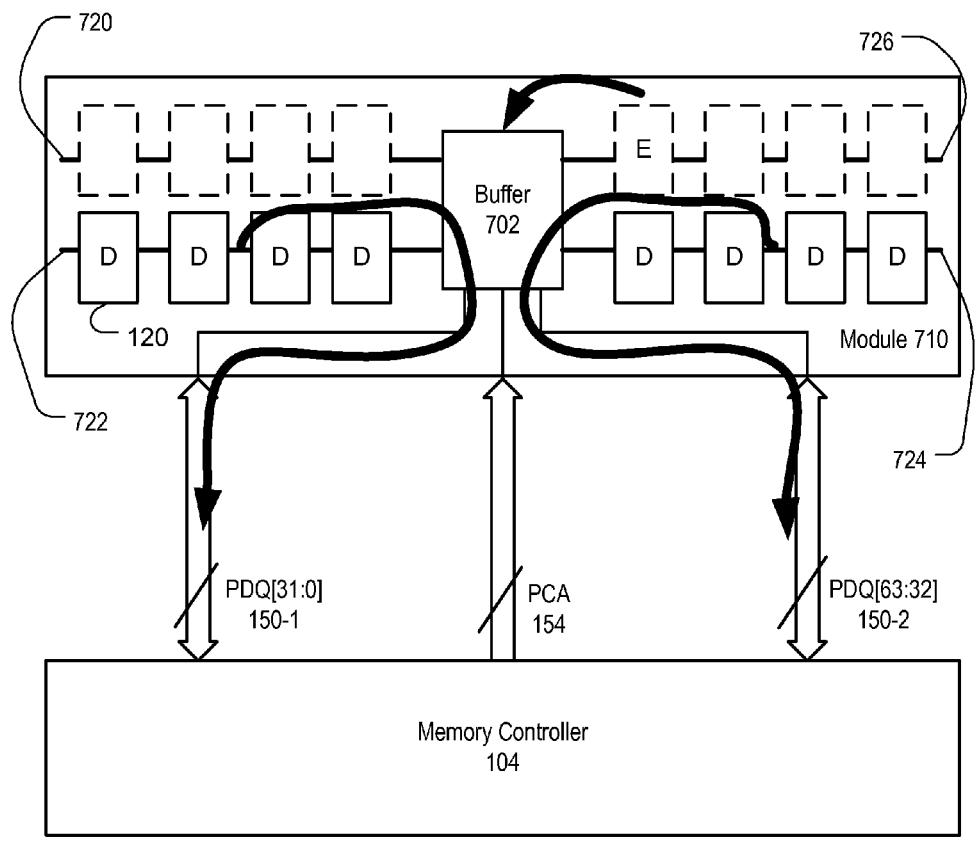

FIG. 7A illustrates ECC coverage for a memory system according to still another embodiment. The embodiment in FIG. 7A is similar to the embodiment in FIG. 3A, but the configuration of the memory buffer 702 and memory module 710 are different to allow data to be retrieved from a full rank of memory devices while retrieving the ECC corresponding to the data from a memory device in a different memory rank. As shown, the memory module 710 now includes two ranks of memory devices 120 (e.g., devices with solid lines are one rank and devices drawn with dashed lines are another rank), and each rank includes eight memory devices 120. The module 610 of FIG. 6 does not have rank groups. Further, the memory buffer 702 now includes multiple sets of secondary data pins supporting multiple secondary data buses (e.g., 720, 722, 724, 726) that are not shared between the ranks of memory. This is in contrast to the memory modules of FIG. 2 and FIG. 3 where the secondary data buses (e.g., SDQ0 and SDQ1) are shared between different memory ranks.

Initially, the memory controller 104 transmits one or more access command to the memory buffer 702 via the PCA link 154. The memory buffer 702 decodes the address information in the access command(s) into a data address and an ECC address. The data address is used to access data from devices in one rank of memory (e.g., the rank marked with the letter "D"). While accessing the data, the buffer 702 uses the ECC address to access ECC from a device in the other rank of memory (e.g., the device marked with the letter "E"). The buffer 702 checks the data against the ECC to detect and correct any data errors. The resulting data is then transmitted to the memory controller 104 via the PDQ links 150. By simultaneously accessing data from a full rank of memory devices 120 and accessing ECC from another rank of memory devices 120, the embodiment in FIG. 7 enables EDC coverage and full bandwidth data access across the PDQ links 150 with only a single memory module 710.

FIG. 7B illustrates decoding a received memory address into secondary addresses according to an embodiment of the memory buffer 702 of FIG. 7A. FIG. 7B is similar to the embodiments of FIG. 5A, 5B, 5C, and 5D. As shown, the PCA address 550 includes a three bit bank address (BA[2:0]), a fifteen bit row address (Row[14:0]), a twelve bit column address (Col[11:0]), and a single rank bit.

For data addressing 510, the PCA address 550 is directly mapped into a single data address 652 for accessing data in a rank of memory devices 120. For ECC addressing 515, the rank bit of the PCA address 550 is inverted and used to select a rank for the ECC access. Inverting the rank bit means that the ECC is mapped to a different rank than its associated data. The bank bits BA[2:0] of the PCA address 550 are treated as a slice address 560 that is decoded into per-device chip select signals for selecting a memory device for the ECC access. Additionally, the three bank bits of the ECC address 756 are filled with the default value "111."

Upon reading this disclosure, those of skill in the art will appreciate still additional alternative designs for memory system with EDC functionality. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the spirit and scope of the disclosure as defined in the appended claims.

What is claimed is:

1. An integrated circuit buffer device, comprising:
a first interface for communicating with a first group of memory devices; and
a second interface for communicating with a second group of memory devices,
wherein the buffer device is configured to access, via the first interface, first data from the first group of memory devices and to access, via the second interface, first error information corresponding to the first data from at least one memory device in the second group of memory devices, and
wherein the buffer device is configured to access, via the second interface, second data from the second group of memory devices and to access, via the first interface, second error information corresponding to the second data from at least one memory device in the first group of memory devices.

2. The buffer device of claim 1, wherein the buffer device is configured to access the first error information from a single memory device in the second group of memory devices.

3. The buffer device of claim 2, wherein the buffer device is configured to receive a memory address and decode the address into one or more data addresses for accessing the first data and one or more error addresses for accessing the first error information.

4. The buffer device of claim 3, wherein the buffer device decodes the received address into one or more error addresses for accessing the first error information by assigning default values to one or more row bits or one or more bank bits of the error addresses.

5. The buffer device of claim 3, wherein the buffer device decodes the received address into one or more error addresses for accessing the first error information by mapping one or more row bits in the received address to one or more column bits of the error addresses.

6. The buffer device of claim 3, wherein the buffer device decodes the received address into one or more error addresses for accessing the first error information by mapping one or more bank bits in the received address to one or more row bits of the error addresses.

7. The buffer device of claim 3, wherein the buffer device decodes the received address into one or more error addresses for accessing the first error information by mapping one or more row bits or one or more bank bits in the received address to a slice address corresponding to the single memory device in the second group of memory devices.

8. The buffer device of claim 1, wherein the buffer device is configured to detect an error in the first data based on the first error information, and to transmit an error indication responsive to detecting the error.

9. The buffer device of claim 1, wherein the buffer device receives an indication of whether to statically enable error checking for data accesses, and wherein the buffer device accesses the first error information and the second error information if the indication specifies that error checking is statically enabled for data accesses.

10. The buffer device of claim 1, wherein the buffer device receives an indication of whether the first data is associated with error information, and wherein the buffer accesses the first error information if the indication specifies that the first data is associated with error information.

11. A memory module, comprising:
a first group of memory devices;
a second group of memory devices; and
a integrated circuit buffer device,
wherein the buffer device accesses first data from the first group of memory devices and accesses first error information corresponding to the first data from at least one memory device in the second group of memory devices, and
wherein the buffer device accesses second data from the second group of memory devices and accesses second error information corresponding to the second data from at least one memory device in the first group of memory devices.

12. A method of operation of an integrated circuit buffer device, the method comprising:
accessing first data from a first group of memory devices and accessing first error information corresponding to the first data from at least one memory device in a second group of memory devices; and
accessing second data from the second group of memory devices and accessing second error information corresponding to the second data from at least one memory device in the first group of memory devices.

13. The method of claim 12, wherein accessing the first error information comprises accessing the first error information from a single memory device in the second group of memory devices.

14. The method of claim 13, wherein accessing the first data and accessing the first error information comprises decoding a received memory address into one or more data addresses for accessing the first data and one or more error addresses for accessing the first error information.

15. The method of claim 14, wherein decoding the received memory address comprises assigning default values to one or more row bits or one or more bank bits of the error addresses.

16. The method of claim 14, wherein decoding the received memory address comprises mapping one or more row bits in the received address to one or more column bits of the error addresses.

17. The method of claim 14, wherein decoding the received memory address comprises mapping one or more bank bits in the received address to one or more row bits of the error addresses.

18. The method of claim 14, wherein decoding the received memory address comprises mapping one or more row bits or one or more bank bits in the received address to a slice address corresponding to the single memory device in the second group of memory devices.

19. The method of claim 12, further comprising:
detecting an error in the first data based on the first error information, and
transmitting an error indication responsive to detecting the error.

20. The method of claim 12, further comprising receiving an indication of whether the first data is associated with error information, and wherein accessing the first error information comprises accessing the first error information if the indication specifies that the first data is associated with error information.

* * * * *